United States Patent [19]
Hyugaji et al.

[11] Patent Number: 5,412,249
[45] Date of Patent: May 2, 1995

[54] SEMICONDUCTOR DEVICE HAVING LAYERED ELECTRODE

[75] Inventors: Masahiko Hyugaji; Reiji Ono, both of Yokohama, Japan

[73] Assignee: Kabushiki Kaisha Toshiba, Kawasaki, Japan

[21] Appl. No.: 214,234

[22] Filed: Mar. 17, 1994

[30] Foreign Application Priority Data

Mar. 31, 1993 [JP] Japan .................. 5-073233

[51] Int. Cl.⁶ ............. H01L 31/0224; H01L 31/0232; H01L 22/482; H01L 29/40
[52] U.S. Cl. ................... 257/745; 257/763; 257/764; 257/766; 257/432; 257/466
[58] Field of Search ............. 257/744, 745, 763, 764, 257/750, 766, 769, 432, 437, 459, 466

[56] References Cited

U.S. PATENT DOCUMENTS

| | | | |
|---|---|---|---|
| 5,047,832 | 9/1991 | Tonai | 257/763 |
| 5,077,599 | 12/1991 | Yano et al. | 257/763 |
| 5,260,603 | 11/1993 | Kamura | 257/745 |

FOREIGN PATENT DOCUMENTS

| | | | |
|---|---|---|---|
| 4129647 | 4/1992 | Germany | 257/745 |
| 0029381 | 3/1981 | Japan | 257/745 |
| 0234562 | 9/1988 | Japan | 257/745 |
| 0304665 | 12/1988 | Japan | 257/745 |
| 4-92471 | 3/1992 | Japan | |

OTHER PUBLICATIONS

Boos et al., The Addition of Ni in AuZn Gate Ohmic Contacts for InP Field Effect Transistors, J. Vac. Sci. Technol. B, vol. 7, No. 3, May/Jun. 1989, pp. 502–504.

Primary Examiner—Rolf Hille
Assistant Examiner—Peter Toby Brown
Attorney, Agent, or Firm—Finnegan, Henderson Farabow, Garrett & Dunner

[57] ABSTRACT

An $n^-$-type InP buffer layer is formed on an n-type InP substrate. An $n^-$-type InGaAs light absorbing layer is formed on the $n^-$-type InP buffer layer. An $n^-$-type InP cap layer is formed on the $n^-$-type InGaAs light absorbing layer. A p-type InP region is formed in the InP cap layer. A layered electrode having a contact with the p-type InP region comprises a first layer made of an Au layer, a second layer made of a Ti layer or the like, a third layer made of a Pt layer or the like, and a fourth layer made of an Au layer. The first layer made of Au has a thickness of 1 to 500 nm. This structure improves an ohmic ability and a peel strength at a contact portion where an electrode is connected, and simplifies manufacturing steps.

5 Claims, 7 Drawing Sheets

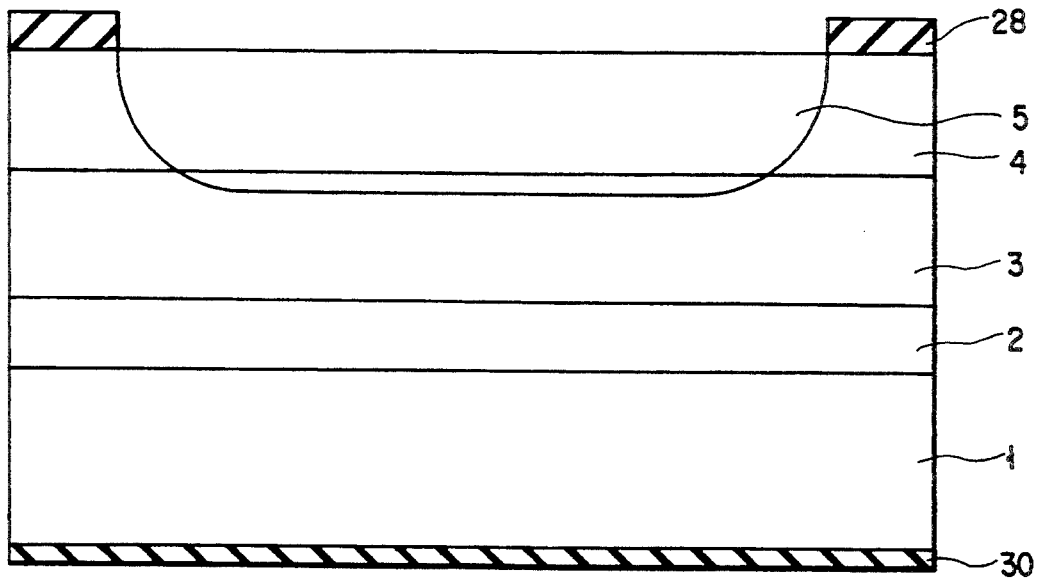
F I G. 5
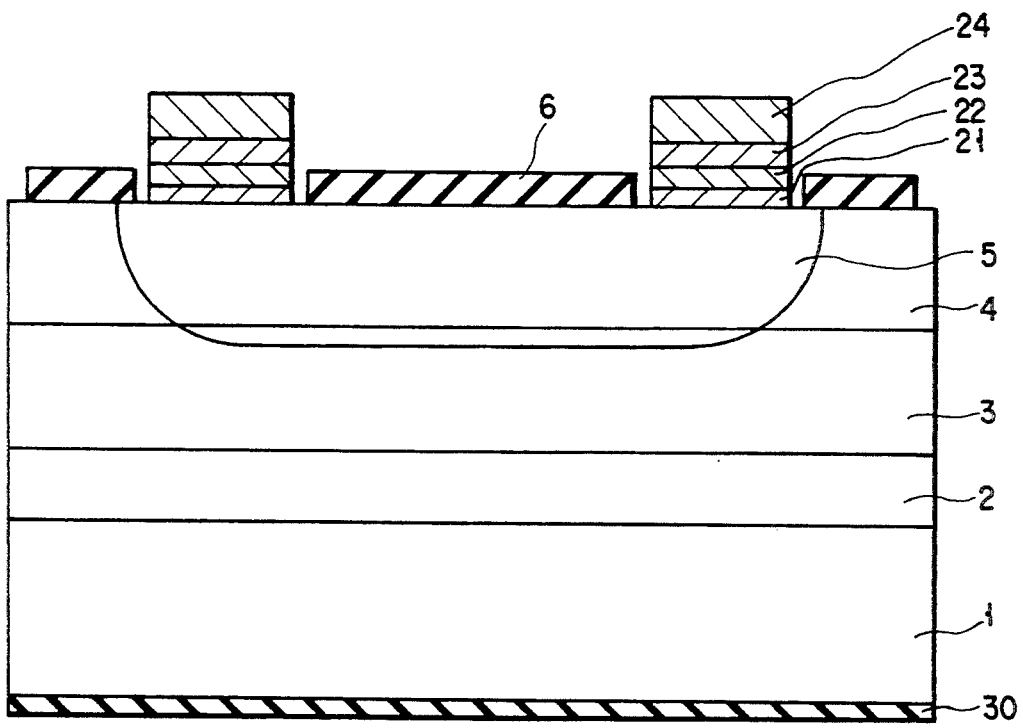
F I G. 6

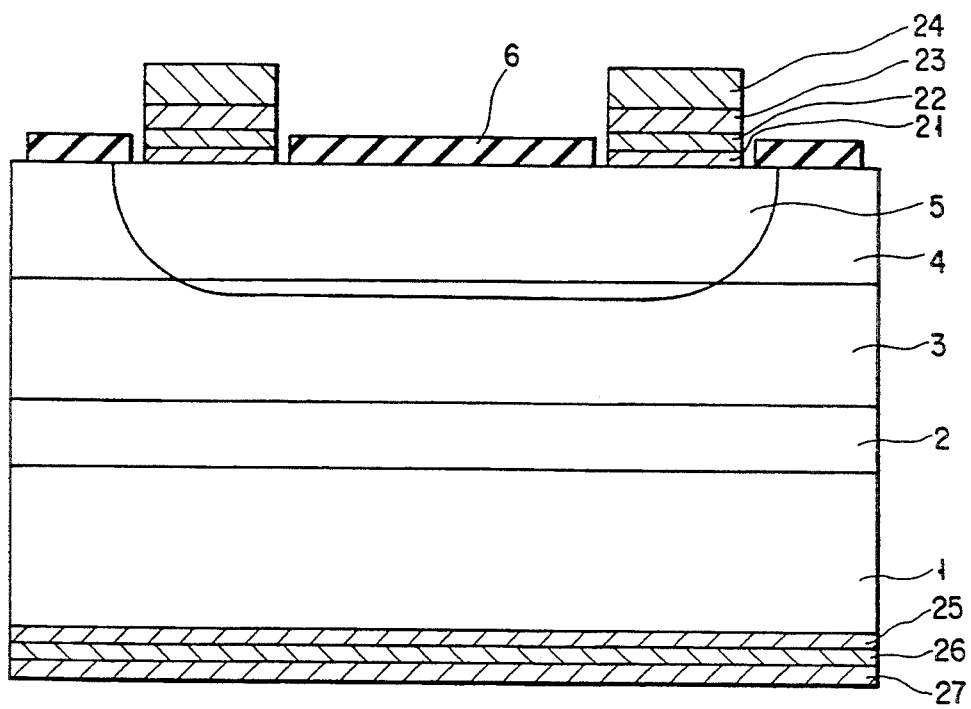
F I G. 7
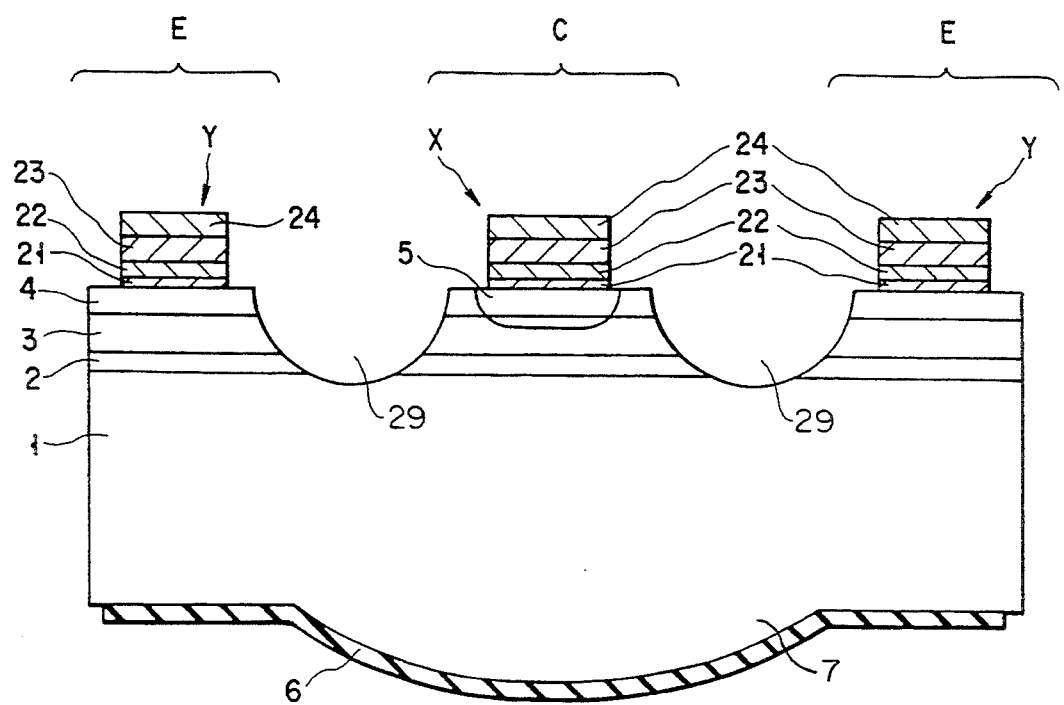
F I G. 8

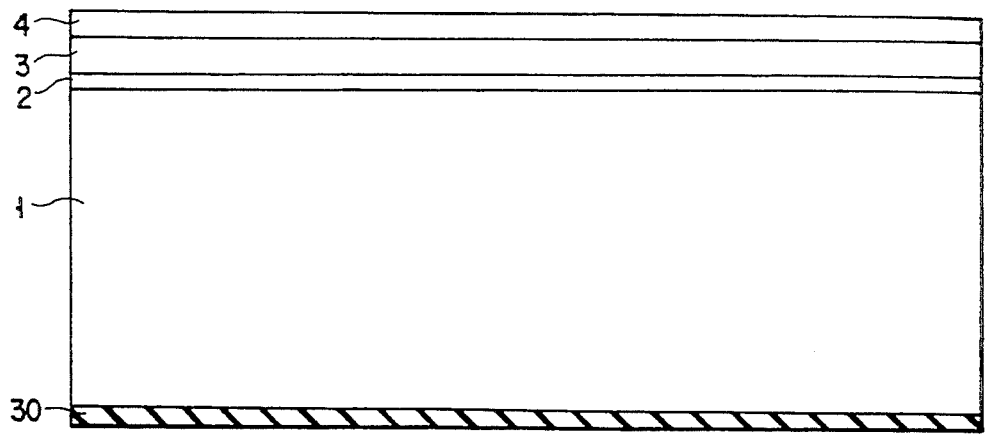
F I G. 10
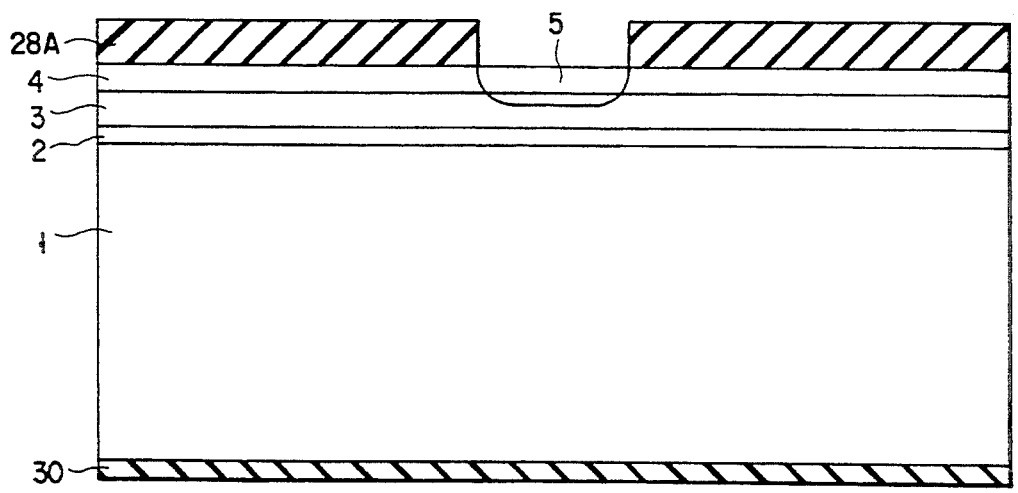
F I G. 11
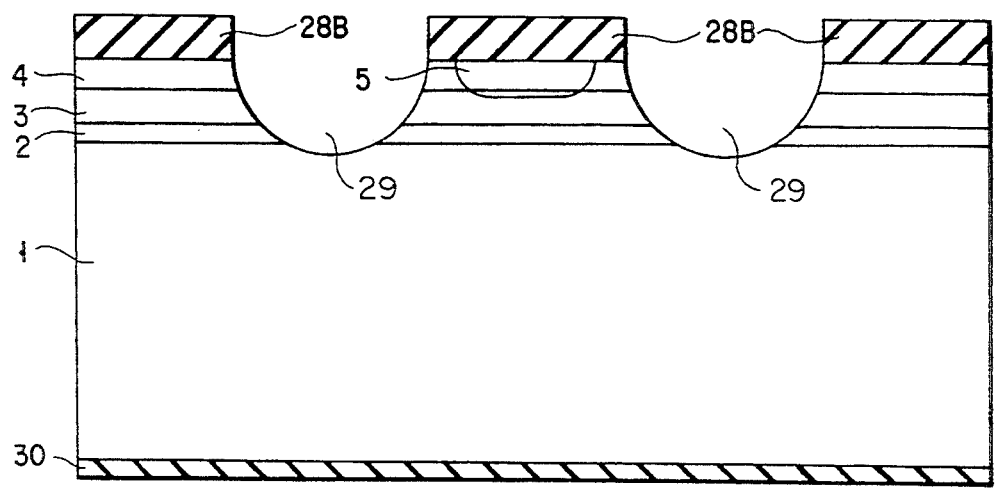
F I G. 12

SEMICONDUCTOR DEVICE HAVING LAYERED ELECTRODE

BACKGROUND OF THE INVENTION

1. Field of the Invention

The present invention relates to an electrode structure which improves an ohmic characteristic and a peel strength of a contact portion between a semiconductor and a metal electrode and which simplifies processing of the contact portion.

2. Description of the Related Art

Conventionally, a semiconductor device using III-V group compounds, such as a transistor, a diode, or the like, has a metal electrode for connecting the device to external electric circuits.

Electrode structures for the metal electrode stated above are divided broadly into two types, i.e., an alloy type and a non-alloy type. At first, an electrode structure of a semiconductor light receiving device used for optical communication will be explained below. There has been a rapid increase in demand for a semiconductor light receiving device in recent years.

FIG. 1 is a cross-sectional view showing an example of an InP/InGaAs-front-illuminated type semiconductor light receiving device (i.e., a photo diode).

The structure of this light receiving device will be explained as follows.

An n-type InP buffer layer 2 is formed on an n⁻-type InP substrate 1. An n⁻-type InGaAs light absorbing layer 3 is formed on the n⁻-type InP buffer layer 2. An n⁻-type InP cap layer 4 is formed on the n⁻-type InGaAs light absorbing layer 3.

A p-type impurity region 5 has a bottom portion positioned in the InGaAs light absorbing layer 3. The impurity region 5 is formed, for example, by selectively diffusing Zn (zinc) as p-type impurities into the InP cap layer 4.

In a light receiving device having the structure stated above, a so-called non-alloy type electrode is formed on a surface of the p-type impurity region. The non-alloy type electrode has a layered structure made of a Ti (titanium) layer 22, a Pt (platinum) layer 23, and an Au (gold) layer 24. The Ti layer 22 has a contact with p-type impurity region 5. Since the Ti 22 does not substantially react with InP contained in the p-type impurity region 5 to make an alloy, the non-alloy electrode stated above is formed.

A so-called alloy type electrode is formed on an InP substrate 1. The alloy type electrode has a layered structure made of an AuGe layer 25, Ni (nickel) layer 26, and an Au layer 27. The AuGe layer 25 has a contact with the InP substrate 1. The AuGe layer 25 reacts with InP of the InP substrate 1 to make an alloy, through a thermal treatment, and thus, an alloy type electrode which achieves an ohmic contact is formed.

In a non-alloy type electrode having a contact with the p-type impurity region 5, Ti layer 22 serves as a wiring layer for a mount or a wire-bonding, and a Pt layer 23 serves as a barrier 22 for preventing interactive diffusion between the Ti layer 22 and the Au layer 24.

The light receiving device stated above is mounted on a ceramic carrier, for example, by means of AuSn soldering, with the surface of the Au layer 27 being interposed as a connection surface. A wire of an AU line is bonded to the Au layer 24. A connection is thus obtained between the above light receiving device and external electric circuits.

However, the above light receiving device has defects as follows.

In a non-alloy type electrode having a contact with the p-type impurity region 5, a Schottky-barrier is easily formed on an interface between the Ti 22 layer and the p-type impurity region 5. As a result, a problem arises in that the Ti layer 22 and the p-type impurity region 5 cannot achieve a sufficient ohmic contact with each other, and the contact therebetween incurs a high resistance.

In addition, the Ti layer 22 which serves as a contact metal does not form an alloy together with InP contained in the p-type impurity region 5, but simply has a contact with the p-type impurity region 5. A peel strength is therefore insufficient between the Ti layer 22 and the p-type impurity region 5, so that the entire layered electrode consisting of layers 22 to 24 is easily peeled off from the light receiving device when an Au wire is bonded onto the Au layer 24. Consequently, the above light receiving device has a problem that the manufacturing yield and the reliability are low.

Meanwhile, as a conventional electrode structure, well-known is one in which an electrode having a contact with the p-type impurity region 5 is of an alloy type electrode in place of a non-alloy type electrode.

This alloy type electrode has, for example, a layered structure made of Au, AuZn, and Au or made of Au, AuCr, and Au, and Au has a contact with an InP cap layer 4. Since Au reacts with InP contained in the p-type impurity region 5 to form an alloy, through a heat treatment, so that an alloy type electrode is formed which can realize an ohmic contact.

Also, this alloy type electrode is characterized in that dopants, such as Zn, Cr, and the like, are introduced into an interface between the electrode and a semiconductor to achieve an ohmic contact which reduces a contact resistance between the electrode and the semiconductor.

However, Au tends to significantly react with InP to form an alloy layer having a high resistance. Therefore, there may be a case that impurities of Zn, Cr, and the likes do not effectively serve as dopants to lower the contact resistance, if a large amount of Au which is a main component of the contact metal reacts with InP to form an alloy.

A reaction of a large amount of Au with InP, as stated above, proceeds as time elapses. Therefore, there is a problem that, if an alloy type electrode is adopted in a planar type device whose electrode and p-n junction are close to each other, as shown in FIG. 1, the p-n junction is destroyed as the alloy-formation proceeds between Au and InP, and the reliability of the device is significantly degraded.

Further, in case of a conventional electrode structure, a p-type electrode (Au/AuZn/Au, Au/AuCr/Au, or the like) having a contact with a p-type impurity layer 5 and an n-type electrode (Au/AuGe/Au or the like) having a contact with an InP substrate 1 must be formed independently from each other.

Recently, developments have been made to a light receiving device of a structure in which a p-type electrode and an n-type electrode are formed on one common surface of a semiconductor substrate. In this kind of light receiving device, there is a problem that the process for forming electrodes is complicated and as a result manufacturing costs are increased, if the p-type and n-type electrodes have different structures.

SUMMARY OF THE INVENTION

The present invention has been made to solve the above problems, and has as its object to improve an ohmic contact and a peel strength of a contact portion between a semiconductor and a metal electrode, and to simplify processing the contact portion.

In order to achieve the object, the semiconductor device according to the present invention comprises a III-V group compound semiconductor containing In and P, and a layered electrode having a contact with the III-V group compound semiconductor. The layered electrode comprises a first layer having a contact with the III-V group compound semiconductor and made of Au or an alloy containing Au as a main component, a second layer provided on the first layer and made of Ti, Cr, W or an alloy containing at least one of these three elements as a main component, a third layer provided on the second layer and made of Pt, Rh, Pd, Ni, Ta, Mo, or an alloy containing at least one of these elements as a main component, and a fourth layer provided on the third layer and made of Au, Al, Pb, or an alloy containing at least one of these elements as a main component.

In addition, the thickness of the first layer of the layered electrode is 1 nm to 500 nm.

In the method of manufacturing a semiconductor device, according to the present invention, a first layer made of Au containing no dopants is firstly formed on a III-V group compound semiconductor containing In and P. Secondly, a second layer made of Ti, Cr, W or an alloy containing at least one of these elements as a main component is formed on the first layer. A third layer is then formed on the second layer, and the layer is made of Pt, Rh, Pd, Ni, Ta, Mo, or an alloy containing at least one of these elements as a main component. At last, a fourth layer made of Au, Al, Pb, or an alloy containing at least one of these elements as a main component is formed on the third layer.

This method is characterized in that Au contained in the first layer reacts with In, P, dopants, or elements constituting the second layer to form an alloy, in a processing step after the step of forming the first layer.

In a structure according to the above method, the first layer which has a contact with a III-V group compound semiconductor containing In and P is made of Au or an alloy containing Au as a main component. In addition, the alloy containing Au as a main component is formed as a result of a reaction of Au with P and In contained in a semiconductor through a heat treatment.

It is therefore possible to improve an ohmic characteristic and a peel strength. Further, since Au of the first layer is of 1 nm or more and 500 nm or less, a p-n junction is not destroyed as an alloy formation proceeds between Au and In and P.

In addition, both of an electrode which has a contact with a semiconductor of a p-type region and another electrode which has a contact with a semiconductor of a n-type region can be formed to have the same structure. Therefore, one common processing can be used to form both of the electrodes, and the processing is thus simplified.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross-section showing one of steps for manufacturing the light receiving device of FIG. 3;

FIG. 6 is a cross-section showing one of steps for manufacturing the, light receiving device of FIG. 3;

FIG. 7 is a cross-section showing one of steps for manufacturing the light receiving device of FIG. 3;

FIG. 8 is a cross-section showing an electrode structure according to the present invention applied into a flip-chip type light receiving device;

FIG. 10 is a cross-section showing one of steps for manufacturing the light receiving device of FIG. 8;

FIG. 11 is a cross-section showing one of steps for manufacturing the light receiving device of FIG. 8;

FIG. 12 is a cross-section showing one of steps for manufacturing the light receiving device of FIG. 8;

DETAILED DESCRIPTION OF THE PREFERRED EMBODIMENTS

In the following, a semiconductor device according to the present invention and a manufacturing method thereof will be specifically explained with reference to the drawings.

Figure 1:
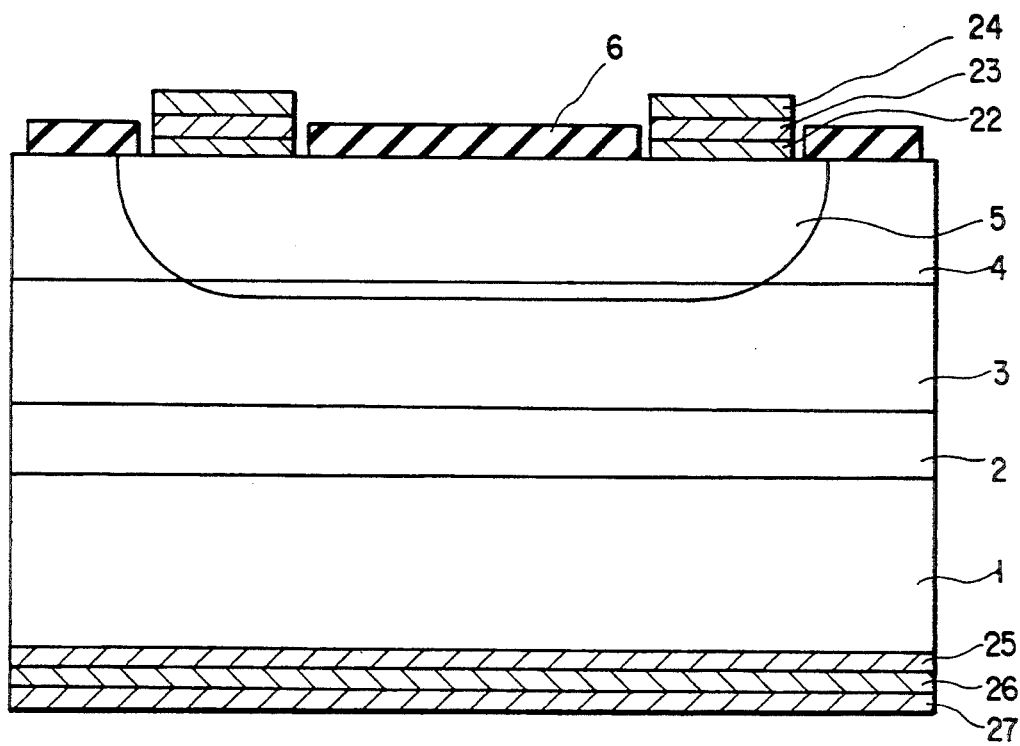
FIG. 1 is a cross-section showing a semiconductor device having a conventional electrode structure.
Figure 2:
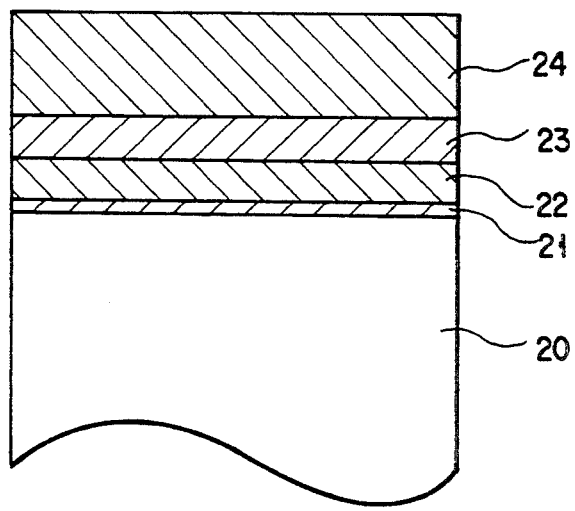
FIG. 2 is a cross-section showing a semiconductor device having an electrode structure according to the present invention.

FIG. 2 shows an electrode structure of a semiconductor device relating to a first embodiment of the present invention. In FIG. 2, the electrode has a contact with a III-V group compound semiconductor, e.g., an n-type InP substrate (or a p-type InP substrate) 20.

The electrode of the semiconductor device of the present invention has a layered structure consisting of an Au layer 21, a Ti layer 22, a Pt layer 23, and an Au layer 24. These layers can be formed one after another, for example, by a vacuum deposition method.

The first layer (which has a contact with the III-V group compound semiconductor) is formed of an Au layer 21. This layer functions to increase bond strength between the InP substrate 20 and a layered electrode. However, if this layer is too thick, the following problems appear.

a) Au reacts with InP to form an alloy layer having a high resistance, and as a result, a contact resistance between the InP substrate 20 and the layered electrode is increased.
b) The alloy layer extends deep in the InP substrate 20, and therefore, a p-n junction is destroyed if any p-n junction is formed in the alloy layer.

Therefore, in the electrode of the semiconductor device according to the present invention, the thickness of an Au layer is 1 to 500 nm.

Compared with a conventional example (e.g., Jpn. Pat. Appln. KOKAI Publication No. 4-92471), the electrode structure of the present invention is characterized in that the first layer, i.e., the Au layer 21 is intentionally designed to contain no dopants (e.g., Ge) which otherwise improves an ohmic contact between the first layer and a semiconductor (the InP substrate).

Specifically, the present inventor discovered that a sufficient ohmic contact can be obtained between a semiconductor and an electrode, as shown in test results explained later, by using Au containing dopants for the first layer having a contact with a III-V group compound semiconductor, and by setting the thickness of the first layer (Au layer) within a range of 1 to 500 nm.

The discovery stated above renders several requisites unnecessary. Specifically, Au containing p-type dopants (e.g., Zn or Cr) needs not be used to form the first layer of a layered electrode for a p-type semiconductor (e.g., InP), and Au containing n-type dopants (e.g., Ge) needs not be used to form the first layer of a layered electrode for an n-type semiconductor.

As a result of this, a common processing can be adopted for forming each of electrodes, i.e., one having a contact with a p-type semiconductor and another having an n-type semiconductor, and thus, contributes to simplification of the electrode formation processing and to reduction in costs for manufacturing a semiconductor device.

The second layer is made of a Ti layer 22. This layer mainly serves to prevent In or P from being diffused in outward directions. The thickness of the Ti layer is therefore set within a range of 50 to 500 nm. In addition, the second layer can be formed of Cr (chrome) or W (tungsten). Use of Cr or W for the second layer does not influence the function of an ohmic contact stated above or the like.

The third layer is formed of a Pt layer 23. This layer mainly serves to prevent an intereactive diffusion between the second layer (e.g., Ti) or the fourth layer (e.g., Au). Particularly, when low-melting point solder such as, AuSn, PbSn, or the like is applied to the surface of the fourth layer and a semiconductor is mounted on a ceramic carrier, the third layer functions to prevent metal atoms contained in the solder from being diffused into the semiconductor, thereby degrading the characteristics of a light receiving device. Consequently, the thickness of the Pt layer must be set within a range from 50 to 500 nm. In addition, this third layer may be formed of a layer of Rh (rhodium), Pd (palladium), Ni (nickel), Ta (tantalum), or Mo (molybdenum) in place of the Pt layer 23. Note that functions of an ohmic contact and the likes are not influenced by the use of Rh, Pd, Ni, Ta, or Mo for the third layer.

The fourth layer is formed of an Au layer 24. This layer serves to form a contact surface having a contact with a bonding pad or a mount. Therefore, the thickness of the Au layer is set to a desired value in accordance with applications of a semiconductor within a range of 50 to 10,000 nm. Further, the fourth layer may be formed of a soldering material, such as AuSn or PbSn, in place of an Au layer 24. The use of Al or a soldering material for the fourth layer enables easy wire-bonding and installation of a mount.

In case of an electrode structure according to the present invention, layered electrodes are formed in an order from the first layer to the second layer, the third layer, and to the fourth layer. Although the Au layer of the first layer which characterizes the present invention does not contain dopants immediately after the first layer is formed, the same Au layer becomes an alloy containing elements forming a semiconductor, dopants also contained in the semiconductor, and elements forming the second layer when the layered electrodes are completed. This is because Au has a characteristic of remarkably reacting with InP to form an alloy, as has already been explained in the preceding section of the prior art.

Relating to a semiconductor device having the above electrode structure (referred to as an invention article, hereinafter), a contact resistance and a peel strength between a semiconductor and an electrode were evaluated. Further, relating to a semiconductor device (referred to as a prior article) having an electrode structure in which the first layer is formed of Ti, the second layer is formed of Pt, and the third layer is formed of Au, the same evaluation was carried out for the sake of comparing an invention article with a prior article.

The evaluation results concerning a contact resistance value are as follows.

The contact resistance value of an invention article was 0.016 $\Omega cm^2$, while that of a prior article was 0.2 $\Omega cm^2$. Specifically, the present article had a excellent contact resistance value equal to or less than 1/10 of that of a prior article.

The followings are results of peel tests in which electrodes were peeled by using a tape.

An invention article did not incur peel-out of electrodes in both cases of using an n-type InP substrate and a p-type InP substrate. In a prior article, the entire layered electrode was peeled off from the InP substrate. That is, the present article can achieve a sufficient peel strength for practical use, compared with a prior article.

Figure 3:
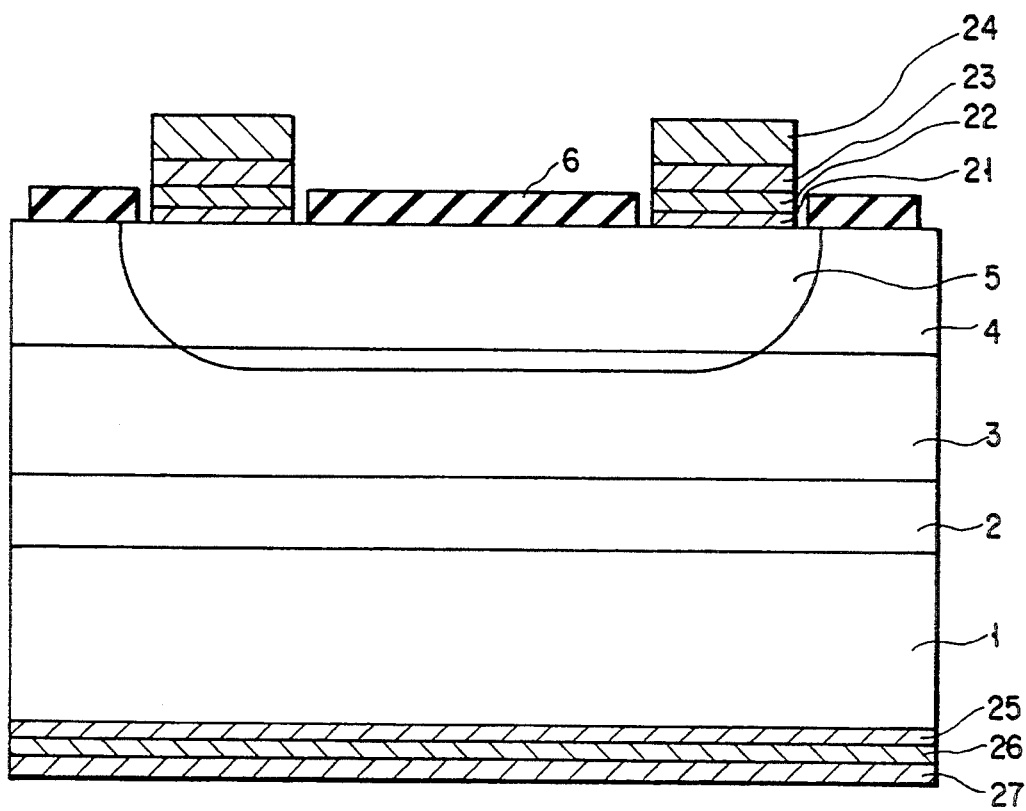
FIG. 3 is a cross-section showing an electrode structure applied into a front-illuminated type light receiving device.

FIG. 3 shows a cross-sectional structure of an electrode structure according to the present invention, where the electrode structure is adopted into a front-illuminated type semiconductor light receiving device (photo diode).

The structure of this light receiving device will be explained below.

An $n^-$-type InP buffer layer 2 is formed on an n-type InP substrate 1. An $n^-$-type InGaAs light absorbing layer 3 is formed on an $n^-$-type InP buffer layer 2. An $n^-$-type InP cap layer 4 is formed on an $n^-$-type InGaAs light absorbing layer 3.

A p-type impurity region 5 has a bottom portion extending deep in the InGaAs light absorbing layer 3. A p-n junction is formed on an interface between the p-type impurity region 5 and the $n^-$-type InGaAs light absorbing layer 3 and between the p-type impurity region 5 and the $n^-$-type InP cap layer 4. The p-type impurity region 5 is formed, for example, by selectively diffusing Zn (zinc) as p-type impurities into InP cap layer 4.

In a light receiving device having the structure stated above, an anti-reflection film 6 is formed on the $n^-$-type InP cap layer 4 and the p-type impurity region 5. An opening portion is partially provided in the anti-reflection film 6 of the p-type impurity region 5.

The layered electrode characterizing the present invention is formed on a surface of a p-type impurity region 5. The layered electrode comprises an Au layer 21 having a thickness of about 10 nm, a Ti layer 22 having a thickness of about 100 nm, a Pt layer 23, and an Au layer 24 having a thickness of about 1000 nm.

A layered electrode consisting of an AuGe layer 25 having a thickness of about 200 nm, an Ni layer 26 having a thickness of about 100 nm, and an Au layer 27 is formed on the n-type InP substrate 1.

In the following, steps of manufacturing surface-incidence type semiconductor light receiving devices are explained.

Figure 4:
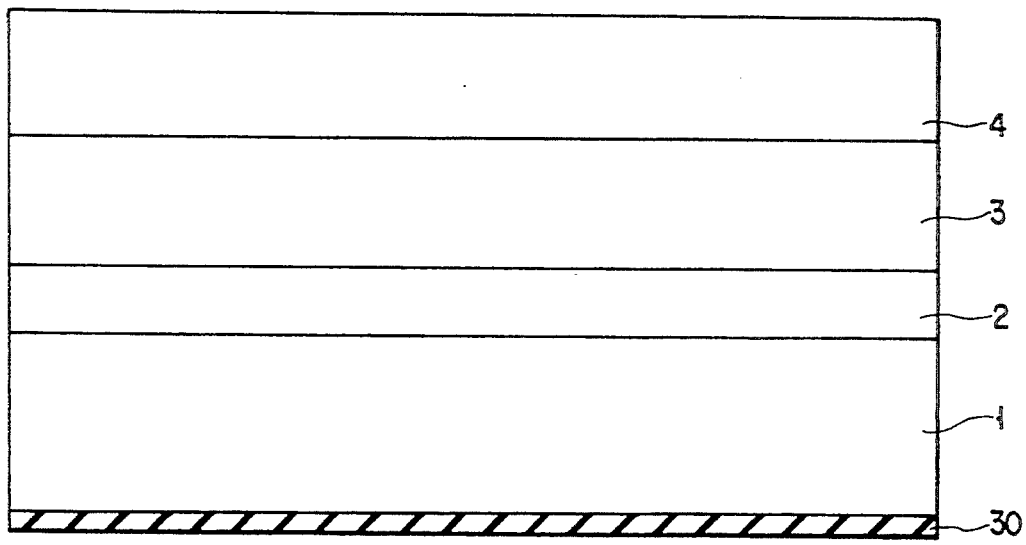
FIG. 4 is a cross-section showing one of steps for manufacturing the light receiving device of FIG. 3.

As shown in FIG. 4, an n-type InP buffer layer 2 having a carrier density of about $1 \times 10^{15}$ cm$^{-3}$ and a thickness of about 2 μm, an InGaAs light absorbing layer having a thickness of about 2 μm, and an n$^-$-type InP cap layer 4 having a carrier density of about $1 \times 10^{15}$ cm$^{-3}$ are formed one after another, in this order, on a main surface of an n+-type InP substrate.

Then, as shown in FIG. 5, a silicon nitride film 28 is formed on the n$^-$-type InP cap layer 4 by a plasma CVD method. The silicon nitride film 28 is subjected to patterning to form a diffusion mask by means of a photolithography. Thereafter, the substrate 1 is placed in a diffusion furnace, and zinc is selectively diffused at 500° C. for about 30 minutes to form a p-type InP region 5, with use of a dimethyl zinc gas as a source material.

Next, as shown in FIG. 6, an anti-reflection film 6 made of silicon nitride is formed at a light receiving portion, after a silicon nitride film 28 is removed. An opening portion is provided in the anti-reflection film 6 on the p-type InP region 5. Thereafter, an Au layer 21 having a thickness of about 10 nm, a Ti layer 22 having a thickness of about 100 nm, a Pt layer 23 having a thickness of about 100 nm, and an Au layer 24 having a thickness of about 1000 nm are formed by a vacuum deposition method. In addition, a p-type layered electrode having a contact with the p-type InP region 5 is formed by subjecting these layers to patterning.

Further, as shown in FIG. 7, an insulating film 30 (see FIG. 6) formed on another main surface of the n+-type InP substrate 1 is removed, and thereafter, an AuGe layer 25 having a thickness of about 200 nm, an Ni layer 26 having a thickness of about 100 nm, and an Au layer 27 having a thickness of about 100 nm are formed by a vacuum deposition method. Thus, an n-type layered electrode having a contact with the n+-type InP substrate 1 is formed.

The front-illuminated type semiconductor light receiving device (i.e., a pin photo diode whose light receiving portion has a diameter of 30 μm) stated above was evaluated with respect to its static characteristic, and the following results were obtained.

A sensitivity of 0.8 A/W was obtained with respect to incidence light of a wavelength of about 1.3 μm having a bias voltage of about 10V and a electric capacitance of about 0.2 pF. This result was proved to be excellently reproducible.

The dynamic characteristic of the above light receiving device was evaluated, and an excellent result was obtained, i.e., −3 dB cut-off frequency was 12 GHz or more.

Twenty pieces of light receiving devices were selected and an acceleration lifetime test for 1,000 hours was carried out in a nitrogen atmosphere at a temperature of about 200° C. with a bias voltage of about 20V being applied thereto. In the test, any characteristic degradation like a increase of a dark current was not found, and these light receiving devices were proved to be enough reliable for practical use. Neither peel-off of a layered electrode nor a defect of wire-bonding which is a factor inviting decreases in yield was found in the test.

Figure 9A:
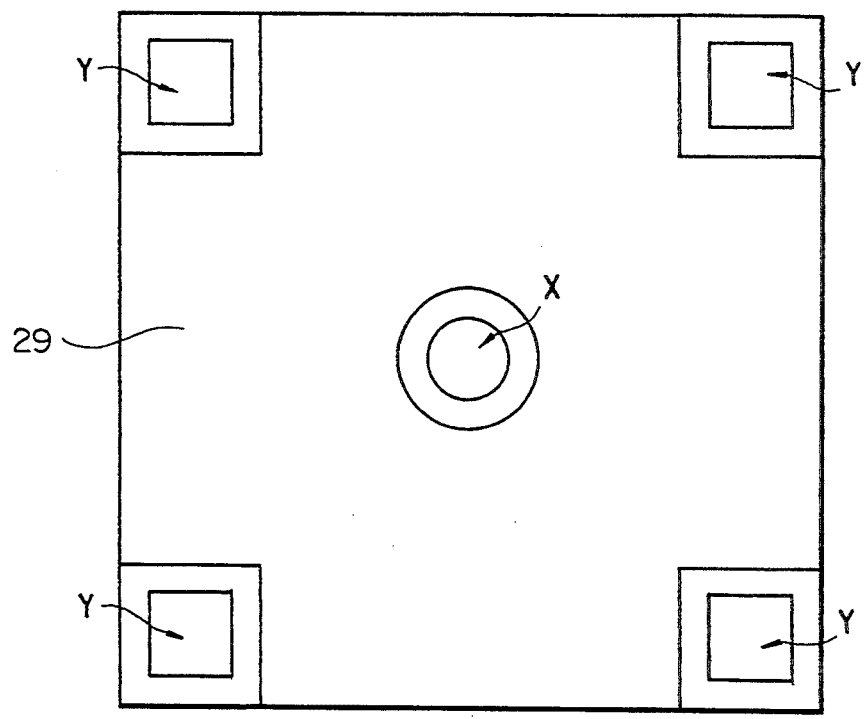
FIG. 9A is a plan view showing the light receiving device of FIG. 8 viewed from one main surface thereof.
Figure 9B:
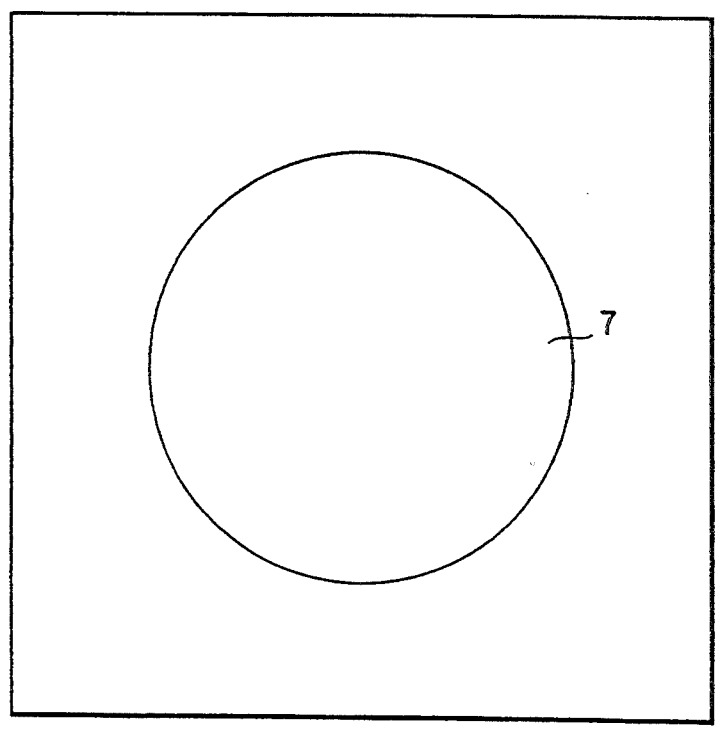
FIG. 9B is a plan view showing the light receiving device of FIG. 8 viewed from another main surface thereof.

FIG. 8 shows a cross-sectional structure of an electrode structure according to the present invention, where the electrode structure is adopted into a back-illuminated flip chip type semiconductor light receiving device (i.e., photo diode). FIG. 9A is a plan view of the light receiving device in FIG. 8, viewed from a main surface of the device. FIG. 9B is a plan view showing the light receiving device in FIG. 8, viewed from another main surface of the device.

The structure of this light receiving device will be explained below.

An n$^-$-type InP buffer layer is formed on a main surface of an n-type InP substrate 1. An n$^-$-type InGaAs light absorbing layer 3 is formed on the n$^-$-type InP buffer layer 2. An n$^-$-type InP cap layer 4 is formed on the n$^-$-type InGaAs light absorbing layer 3.

A groove 29 is formed in the n$^-$-type InP cap layer 4 and the groove 29 has a bottom portion extending to the n-type InP substrate 1. In addition, the groove 29 divides the n$^-$-type InP buffer layer 2, the n$^-$-type InGaAs light absorbing layer 3, and the n$^-$-type InP cap layer 4 into a central portion C and end portions E.

A p-type impurity region 5 is formed in the InP cap layer 4 of the central portion C. The p-type impurity region 5 has a bottom portion positioning in the InGaAs light absorbing layer 3. A p-n junction is formed on an interface between the p-type impurity region 5 and the n$^-$-type InGaAs light absorbing layer 3 and between the p-type impurity region 5 and the n$^-$-type InP cap layer 4. The p-type impurity region 5 is formed by selectively injecting, for example, Zn (zinc) as P-type impurities into the InP cap layer 4.

A lens 7 is formed on another main surface of the n-type InP substrate 1. An anti-reflection film 6 is further formed on this surface (including the portion thereof formed as the lens 7).

Layered electrodes characterizing the present invention are formed on the surface of the p-type impurity region 5 at the central portion C, and on n$^-$-type InP cap layers 4 at both end portions E. Each of the layered electrodes consists of an Au layer 21 having a thickness of about 10 nm, a Ti layer 22 having a thickness of about 100 nm, a Pt layer 23, and an Au layer 24 having a thickness of about 1,000 nm.

Specifically, a p-type layered electrode x having a contact with the p-type InP region 5 has the same structure as that of an n-type layered electrode Y having a contact with the n$^-$-type InP cap layer 4.

Next, steps of manufacturing the back-surface incidence flip chip type semiconductor light receiving device will be explained below.

At first, as shown in FIG. 10, an n-type InP buffer layer 2 having a density of about $1 \times 10^{15}$ cm$^{-3}$ and a thickness of about 2 μm, an InGaAs light absorbing layer 3 having a thickness of 2 μm, and an InP cap layer 4 having a carrier density of about $1 \times 10^{15}$ cm$^{-3}$ and a thickness of about 1 μm are formed one after another on a main surface of an n+-type InP substrate 1 by an MOCVD method.

Then, as shown in FIG. 11, a silicon nitride film 28A is formed on the n⁻-type InP cap layer 4 by a plasma CVD method. The silicon nitride film 28A is subjected to patterning to form a diffusion mask. Thereafter, the substrate 1 is placed in a diffusion furnace and zinc is selectively diffused at 500° C. for about 30 minutes to form a p-type InP region 5, using a dimethyl zinc gas as a material.

As shown in FIG. 12, a silicon nitride film 28A is then removed and thereafter, another silicon nitride film 28B is formed by a plasma CVD method. The silicon nitride film 28B is subjected to patterning by a photolithography. In order to separate a contact region of a p-type electrode at a central portion C and other contact regions of n-type electrodes at both end portions E from each other, a substrate 1, a buffer layer 2, a light absorbing layer 3, and a cap layer 4 are respectively etched by a wet-etching method, thereby forming a groove 29 surrounding the p-type InP region 5 at the central portion C.

Figure 13:
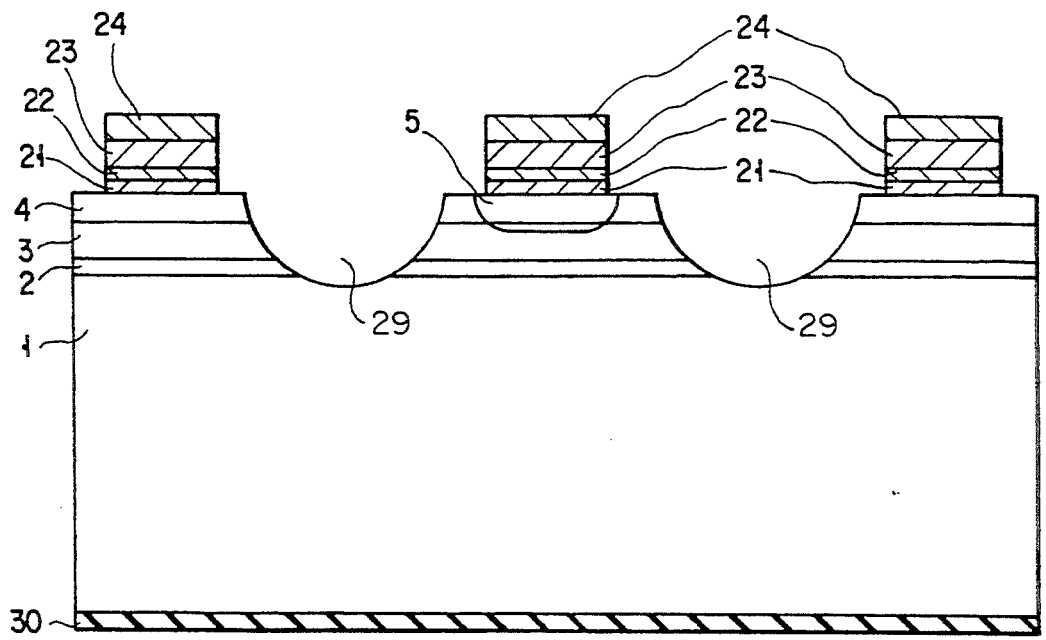
FIG. 13 is a cross-section showing one of steps for manufacturing the light receiving device of FIG. 8.

Next, as shown in FIG. 13, a silicon nitride film 28B is removed, and thereafter, an Au layer 21 having a thickness of about 10 nm, a Ti layer 22 having a thickness of about 100 nm, a Pt layer 23 having a thickness of about 100 nm, and an Au layer 24 having a thickness of about 1,000 nm are formed on a contact region of the p-type electrode at the central portion C and on each of contact regions of n-type electrodes at both end portions E, by a vacuum deposition method. These layers are subjected to patterning to simultaneously form each of a p-type layered electrode X having a contact with the p-type InP region 5 and an n-type layered electrode Y having a contact with the n⁻-type InP cap layer 4.

Figure 14:
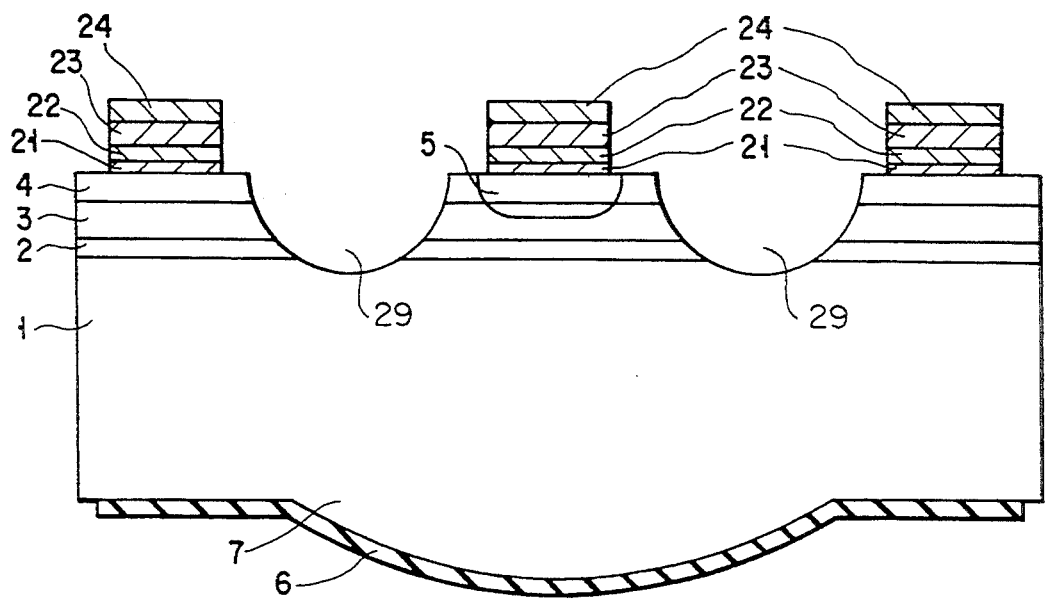
FIG. 14 is a cross-section showing one of steps for manufacturing the light receiving device of FIG. 8.

Next, as shown in FIG. 14, an insulating film 30 (see FIG. 13) formed on one main surface of the n+-type InP substrate 1 (i.e., on the back-surface which receives light) is removed, and thereafter, a resist is formed on another main surface of the n+-type InP substrate 1 so as to have a lens-like shape. Further, the entire back-surface of the n+-type InP substrate 1 is etched by ion milling to form an InP monolithic lens 7. At last, an anti-reflection prevent film 6 made of silicon nitride is formed at a light receiving portion by a plasma CVD method.

Both the p-type and n-type electrodes of the back-illuminated flip chip type semiconductor light receiving device as stated above are simultaneously mounted on a specific ceramic carrier, for example, by AuSn soldering. In this respect, measurement tests were carried out with respect to the junction strength of the chips. The measurement tests showed that an average junction strength was 80 gf and no defects caused by peel-off of electrodes were found with respect to the mounting strength of the chips.

Initial properties and a reliability of the back-illuminated flip chip type semiconductor light receiving device was found to be excellent as in case of the beforegoing front-illuminated type semiconductor light receiving device. In the embodiments of the present invention, since p-type and n-type electrodes have one common electrode structure, these electrodes can be formed simultaneously. A time period required for manufacturing an element can therefore shortened, and an yield can be improved. This contributes to decreases in manufacturing costs.

An electrode structure according to the present invention can be applied into a light-emitting diode, a semiconductor laser, or the like, in addition to an application for a light receiving device. It is needless to say that the electrode structure has advantages in that the contact resistance between a semiconductor and electrodes are reduced, peel-off of electrodes is restricted, the mounting junction strength is improved, and the lifetime of an element is extended.

Applications of the present invention are not limited to optical devices. The present invention can be applied to electric devices, such as a high electron mobility transistor (HEMT), a field effect transistor (MISFET, MESFET), and a hetero-bipolar transistor (HBT), and for a photoelectric IC (OEIC) using a combination thereof. In the latter cases, the present invention can ensure advantages in that the contact resistance between a semiconductor and electrodes are reduced, peel-off of electrodes is restricted, the mounting junction strength is improved, and the lifetime of an element is extended.

A material containing In and P, e.g., an InP substrate or InGaAsP can be used as a III-V compound semiconductor.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device including a III-V group compound semiconductor containing In and P, and a layered electrode having a contact with the III-V group compound semiconductor, said layered electrode comprising:

a first layer having a contact with the III-V group compound semiconductor and made of Au or an alloy containing Au as a main component;

a second layer provided on the first layer and made of Ti, Cr, W or an alloy containing at least one of these elements as a main component;

a third layer provided on the second layer and made of Pt, Rh, Pd, Ni, Ta, Mo, or an alloy containing at least one of these elements as a main component; and a fourth layer provided on the third layer and made of Au, Al, Pb, or an alloy containing at least one of these elements as a main component.

2. A semiconductor device according to claim 1, wherein the first layer of the layered electrode has a thickness of 1 nm to 500 nm.

3. A semiconductor device according to claim 1, wherein the III-V group compound semiconductor includes a p-type impurity region and an n-type impurity region, the layered electrode is provided on the p-type impurity region, and a layered electrode including a first layer having a contact with the n-type impurity region and made of AuGe, a second layer formed on the first layer and made of Ni, and a third layer formed on the second layer and made of Au is provided on the n-type impurity region 4. A semiconductor device according to claim 1, wherein the III-V group compound semiconductor includes a p-type impurity region and an n-type impurity region, and the layered electrode is provided on each of the p-type and n-type impurity regions.

5. A semiconductor device according to claim 1, wherein the III-V group compound semiconductor further comprises an n-type surface layer and a p-type impurity region formed in a portion of a main surface region of the n-type surface layer, the layered electrode is provided on each of the p-type impurity region and a portion of the n-type surface layer, and a lens is formed on another main surface of the III-V group compound semiconductor.

* * * * *